(12) United States Patent
Benzinger et al.

(10) Patent No.: US 7,102,912 B2
(45) Date of Patent: Sep. 5, 2006

(54) INTEGRATED SEMICONDUCTOR MEMORY DEVICE AND METHOD FOR OPERATING AN INTEGRATED SEMICONDUCTOR MEMORY DEVICE

(75) Inventors: Herbert Benzinger, München (DE); Jörg Kliewer, München (DE); Manfred Pröll, Dorfen (DE); Stephan Schröder, München (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/071,590

(22) Filed: Mar. 4, 2005

(65) Prior Publication Data

US 2005/0195638 A1    Sep. 8, 2005

(30) Foreign Application Priority Data

Mar. 4, 2004    (DE) .................. 10 2004 010 704

(51) Int. Cl.
*G11C 11/00* (2006.01)
(52) U.S. Cl. .................. 365/148; 365/189.03
(58) Field of Classification Search ............ None
See application file for complete search history.

(56) References Cited

U.S. PATENT DOCUMENTS 6,333,882 B1 * 12/2001 Merritt et al. ............ 365/203

2001/0002886 A1 * 6/2001 Ooishi .................. 365/196

* cited by examiner

*Primary Examiner*—Amir Zarabian
*Assistant Examiner*—Kretelia Graham
(74) *Attorney, Agent, or Firm*—Edell, Shapiro & Finnan, LLC

(57) ABSTRACT

An integrated semiconductor memory device includes a memory cell array (B1) with a first bit line and a second bit line (BL, /BL), a controllable resistor (SW) and a control unit (100) configured to control the controllable resistor. In a first operating state of the integrated semiconductor memory device, the first and second bit lines are connected to one another via a first controllable switch (ET1) and also via the controllable resistor (SW) which has been set to a low resistance, to a connection (A10) that applies a mid-voltage ($V_{BLEQ}$), where the voltage level of the mid-voltage is in the form of an arithmetic mean between a first and second voltage potential (VBLH, VBLL). By virtue of the control unit briefly setting the controllable resistor to a very low resistance in the first operating state of the integrated semiconductor memory device, the period of time required for the first and second bit lines require to assume the mid-voltage ($V_{BLEQ}$) is shortened. The influence of capacitive coupling influences, which slow down the charging of the first and second bit lines to the mid-voltage, is significantly reduced as a result.

28 Claims, 5 Drawing Sheets

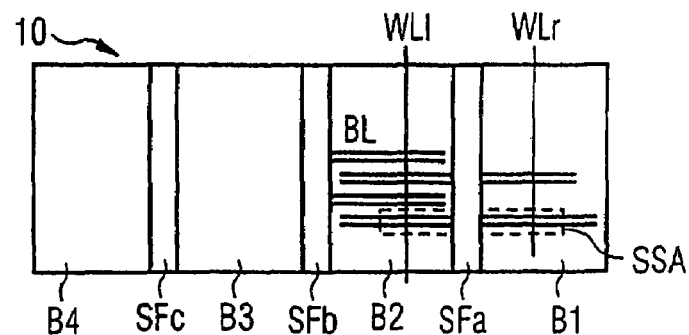
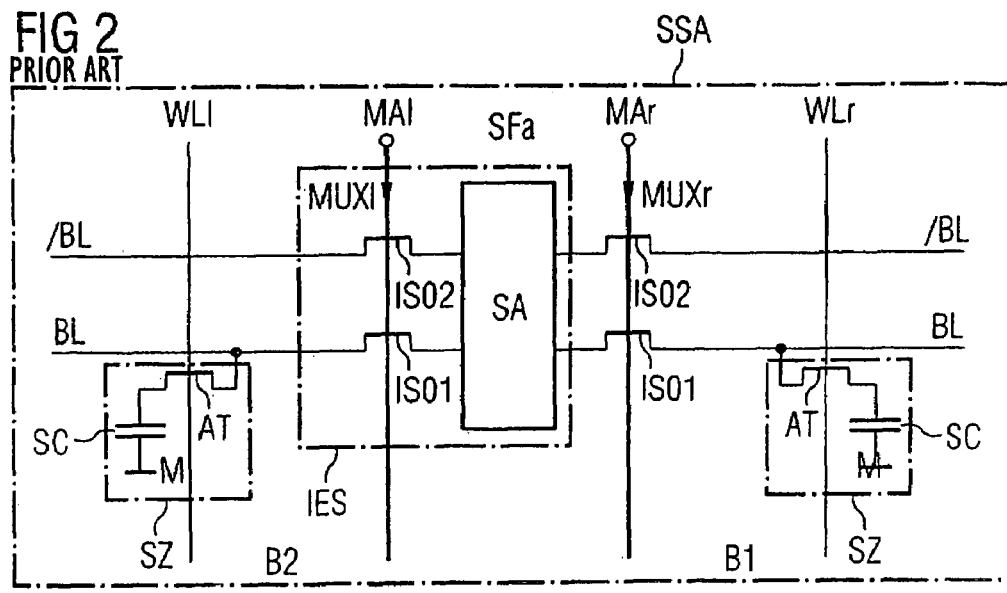
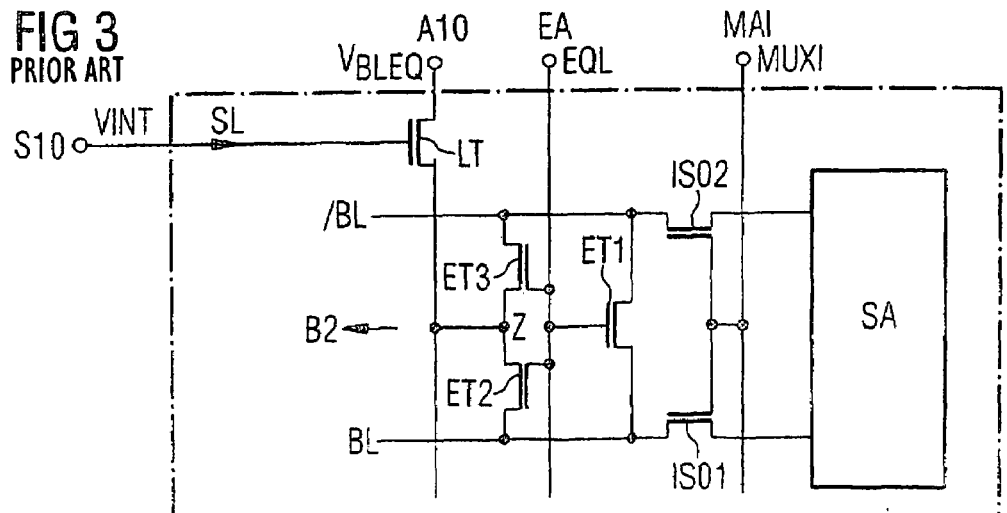

US 7,102,912 B2

1

INTEGRATED SEMICONDUCTOR MEMORY DEVICE AND METHOD FOR OPERATING AN INTEGRATED SEMICONDUCTOR MEMORY DEVICE

CROSS REFERENCE TO RELATED APPLICATIONS

This application claims priority under 35 U.S.C. §119 to German Application No. DE 10 2004 010 704.1, filed on Mar. 4, 2004, and titled "Integrated semiconductor memory device and Method for Operating an Integrated semiconductor memory device," the entire contents of which are hereby incorporated by reference.

FIELD OF THE INVENTION

The invention relates to an integrated semiconductor memory device with potential equalization between a first and a second bit line, and to a method for operating an integrated semiconductor memory device.

BACKGROUND

In an integrated semiconductor memory device, for example a DRAM (Dynamic Random Access Memory) semiconductor memory, the memory cells are arranged in a matrix-like memory cell array, the matrix-like shape of the memory cell array being obtained from the essentially vertically running word lines and horizontally running bit lines. During access to a memory cell, the memory cell is conductively connected to one of the bit lines by an appropriate signal on the word line. At the end of the bit line there is a sense amplifier which detects the cell signal transmitted via the bit line and amplifies it. The amplified signal is first written back to the cell via the bit line and can then be read to the outside. This process takes place simultaneously for all memory cells which are associated with a word line. This means that, after a word line has been activated, all of the bit lines within the memory cell array have a signal applied to them.

To make the arrangement of the memory cell array as compact as possible, it is desirable to have bit lines which are as long as possible. On the other hand, however, this results in a reduction in the signal that the sense amplifier can detect. The memory cell area of an integrated semiconductor memory device is therefore generally split into individual memory cell arrays. FIG. 1 shows a memory cell area 10 in an integrated semiconductor memory device which is split into the memory cell arrays B1, B2, B3 and B4. Between the individual memory cell arrays, the sense amplifiers run in a sense amplifier strip SFa, a sense amplifier strip SFb and a sense amplifier strip SFc. In the memory cell arrays B1 and B2, respective horizontally running bit lines BL and, running vertical thereto, word lines WL1 and WLr are shown. Pairs of bit lines are respectively connected to sense amplifiers in the sense amplifier strips SFa and SFb, respectively.

To obtain an arrangement for the memory cell array which is as compact as possible, the sense amplifiers are used to amplify signals on a bit line in the first or second memory cell array, depending on the activated word line. A single sense amplifier can thus be used to access either a memory cell in the first memory cell array B1 or a memory cell in the second memory cell array B2.

To clarify this central idea behind the sense amplifiers, FIG. 2 shows an enlarged view of the block SSA, shown in dashes in FIG. 1, in the memory cell area 10. The sense amplifier SA, which is in the sense amplifier strip SFa, is respectively connected to a bit line BL and to a complementary bit line /BL in the first memory cell array B1 and in the second memory cell array B2. In FIG. 2, the bit lines BL in the first and second memory cell arrays B1 and B2 each have a DRAM memory cell connected to them, for example. The DRAM memory cell contains a selection transistor AT whose controllable path is connected to the first electrode of a storage capacitor SC. The second electrode of the storage capacitor is connected to a reference potential M. The selection transistor AT of the memory cell SZ in the first memory cell array can be controlled using a control signal on the word line WL1. The selection transistor of the memory cell SZ, which is in the second memory cell array, can be actuated using a corresponding control signal on the word line WLr.

To read cell information which is stored in the memory cell, the selection transistor is switched to the conductive state by applying the control signal. The charge stored on the storage capacitor SC flows via the controllable path in the selection transistor AT to the bit line BL and alters the potential thereof. The sense amplifier SA connected to the end of the bit line amplifies a fall in potential or a rise in potential on the bit line, depending on the stored cell information. The sense amplifier ensures that, by way of example, in the case of a fall in potential on the bit line BL, a low voltage level VBLL is applied to the bit line BL. Conversely, a high voltage level VBLH is applied to the complementary bit line.

When reading a memory cell SZ, which is in the first memory cell array B1, it is necessary to turn on the switching transistor ISO1 or ISO2, which connects the sense amplifier SA to the bit line BL or to the complementary bit line /BL. To this end, the control signal MUXr is applied to the control connection MAr of the two switching transistors. If it is necessary to read a memory cell in the second memory cell array B2, the sense amplifier SA is connected to the bit line BL or to the complementary bit line /BL in the second memory cell array by means of the switching transistors ISO1 and ISO2, respectively, arranged in the second memory cell array. In this case, the control signal MUX1 is applied to the control connection MA1 of the switching transistors in the second memory cell array B2 and turns on the two switching transistors.

As can be seen from FIG. 1, the word line WLr or WL1 in the first or second memory cell array is connected to all bit lines which are present in this memory cell array. This means that when a word line is activated, for example the word line WL1 in the second memory cell array B2, all of the memory cells which can be actuated by this word line are conductively connected to the bit lines which are connected to them. This applies a voltage signal to all bit lines in the second memory cell array. All other memory cell arrays remain in the deactivated state.

In the deactivated state, the bit lines need to be charged to a common uniform voltage level as quickly as possible during a precharging process, in order to allow fresh access to the same memory cell array after the shortest possible time period. This prevents any influence during a fresh access operation by a random potential state on the bit lines, for example on account of a previous read access operation.

To clarify the way in which the circuit elements involved in a precharging process work, the circuit component IES (shown in dashed lines in FIG. 2), which is based on the prior art, is shown in an enlarged view in FIG. 3. FIG. 3 shows the sense amplifier SA in the sense amplifier strip SFa, which is connected to the bit line BL or to the complementary bit line /BL in the second memory cell array B2 via the two switching transistors ISO1 and ISO2. During access to the second memory cell array B2, the transistors ISO1 and ISO2 are turned on by applying the control signal MUX1 to their common control connection MA1. The bit line BL and the complementary bit line /BL in the second memory cell array are conductively connected to the sense amplifier SA in this case. The bit lines BL and /BL can also be connected to one another by means of a first switching transistor ET1. In addition, a second switching transistor ET2 and the transistor LT acting as a current limiter connect the bit line BL to the connection A10 for applying the mid-voltage $V_{BLEQ}$. A third switching transistor ET3 and the transistor LT for current limiting likewise connect the complementary bit line /BL to the connection A10 for applying the mid-voltage $V_{BLEQ}$. In this case, the mid-voltage $V_{BLEQ}$ is in the form of a voltage level between a high voltage level VBLH and a low voltage level VBLL. The high voltage level VBLH corresponds to the logic 1 information item and the low charge level VBLL corresponds to the logic 0 information item in this case. The two switching transistors ET2 and ET3 are connected to one another via a common connection Z. The three switching transistors ET1, ET2 and ET3 can be controlled by applying a control signal EQL to a common control connection EA. The transistor for current limiting LT can be controlled by applying a control signal SL to its control connection S10.

The precharging process generally takes place after a read or write access operation. To this end, the switching transistors ET1, ET2 and ET3 are turned on by applying the control signal EQL to their common control connection EA. At the same time, the transistor LT for current limiting is also turned on by applying the control signal SL to its control connection S10. The bit line BL and the complementary bit line /BL are connected to one another by means of the first switching transistor ET1, which is on. In addition, the second switching transistor ET2 and the transistor LT for current limiting connect the bit line BL to the connection A10 for applying the mid-voltage $V_{BLEQ}$. Similarly, the transistor LT for current limiting and the third switching transistor ET3 connect the complementary bit line /BL to the connection A10 for applying the mid-voltage $V_{BLEQ}$. The connection of the bit line BL and the complementary bit line /BL to the connection A10 for applying the mid-voltage $V_{BLEQ}$ and also the connection of the bit line BL and the complementary bit line /BL via the first switching transistor ET1, which is on, mean that a common equalization potential which corresponds to the mid-voltage $V_{BLEQ}$ will appear on the two bit lines.

FIGS. 4A to 4C illustrate the voltage states on the bit lines BL and /BL while the bit lines are being precharged to the mid-voltage $V_{BLEQ}$. FIG. 4A shows four sense amplifiers SA1, SA2, SA3 and SA4 which are respectively connected to a bit line pair which includes the two bit lines BL and /BL. The fact that the bit line pairs are adjacent to one another at a short physical distance and also the small feature widths of the individual bit lines mean that the bit line pairs are capacitively coupled to one another. In addition, the complementary bit line /BL connected to the first sense amplifier SA1 is capacitively coupled via a first parasitic coupling capacitor CK1 to the bit line BL which is connected to the second sense amplifier SA2. The complementary bit line /BL connected to the second sense amplifier SA2 is connected via a second parasitic coupling capacitor CK2 to the bit line BL which is connected to the third sense amplifier SA3. The complementary bit line /BL connected to the third sense amplifier SA3 is connected via a third parasitic coupling capacitor CK3 to the bit line BL which is connected to the fourth sense amplifier SA4. By activating the word line WL, the memory cells SZ connected to the bit lines are applied to the bit lines, and the information stored in them is amplified. In the example in FIG. 4A, the bit lines denoted by "0" have memory cells SZ connected to them that store a logic 0 information item. The bit lines denoted by "1" have memory cells connected to them which store a logic 1 information item. When the memory cells SZ connected to the bit lines BL and /BL are read, the bit lines denoted by "0" assume the low voltage level VBLL, for example 0V, and the bit lines denoted by "1" assume the high voltage level VBLH, for example 1.5 V.

The low voltage potential on the complementary bit line /BL connected to the second sense amplifier SA2 and the high voltage potential on the bit line BL connected to the third sense amplifier SA3 charge the second parasitic coupling capacitor CK2 to a high voltage level of, by way of example, 1.5 V, which corresponds to the voltage level VBLH. The charge stored on the second parasitic coupling capacitor CK2 produces a voltage offset on the complementary bit line /BL connected to the second sense amplifier SA2, which bit line has been charged to the low voltage level VBLL. Similarly, a voltage shift is produced on the bit line BL which is connected to the third sense amplifier SA3.

FIG. 4B shows the voltage potential on the bit lines BL and /BL connected to the sense amplifier SA2 during a read access operation and a subsequent precharging process. Assuming that the memory cell SZ connected to the bit line BL stores a logic 1 information item, the bit line BL is charged to the high voltage level VBLH during a read access operation up to the time TP. Conversely, the complementary bit line assumes the low voltage level VBLL, corresponding to the logic 0 information item. At the time TP, the bit line BL and the complementary bit line /BL are conductively connected via the switching transistor ET1 shown in FIG. 3. The common voltage potential which is then put on the bit line pair is a potential VO, which is below the mid-voltage $V_{BLEQ}$ on account of the negative offset voltage on the bit line /BL.

FIG. 4C shows the voltage potential on the bit lines BL and /BL connected to the sense amplifier SA3 during a read access operation and a subsequent precharging process. During the read access operation, the bit line BL is charged to the high voltage level VBLH, which corresponds to the logic 1 information item. The complementary bit line has assumed the low voltage level VBLL, which corresponds to the logic 0 information item. At the time TP, the precharging process starts. The bit line BL and the complementary bit line /BL are connected via the first switching transistor ET1 shown in FIG. 3, which is on. The common voltage potential which is then put on the bit line pair is a potential VO, which is above the mid-voltage $V_{BLEQ}$ on account of the positive offset voltage on the bit line BL.

Since, as FIG. 3 shows, the current limiter transistor LT and the second switching transistor ET2 connect the bit line BL, and the current limiter transistor LT and the third switching transistor ET3 connect the complementary bit line /BL, to the connection A10 for applying the mid-voltage $V_{BLEQ}$, the common voltage potential which appears on the bit line pair after the time TA has elapsed will be the potential $V_{BLEQ}$ again. In FIG. 4B, the voltage potential on the bit line pair BL and /BL starts from a voltage offset VO which is below the mid-voltage and approaches the mid-voltage $V_{BLEQ}$. In FIG. 4C, the voltage potential on the bit line pair BL and /BL starts from a voltage offset VO which is above the mid-voltage and approaches the mid-voltage $V_{BLEQ}$. The voltage $V_{BLEQ}$ connected to the connection A10 is between the high voltage potential VBLH, which corresponds to the logic 1 information item, and the low voltage potential VBLL, which corresponds to the logic 0 information item. Preferably, it corresponds to the arithmetic mean from the voltage VBLH and the voltage VBLL to which the bit line BL and the complementary bit line /BL are charged.

Referring again to FIG. 4A, no charges are stored on the first coupling capacitance CK1 and the third coupling capacitance CK3. The reason for this is that the first coupling capacitance CK1 connects two bit lines that are each charged to a voltage potential VBLH, which corresponds to the logic state 1. The coupling capacitance CK3 connects two bit lines which are each charged to the voltage potential VBLL, which corresponds to the logic state 0.

A voltage shift VO appears at the start of a precharging process only if one of the capacitively coupled bit lines has been charged using a high voltage potential and the other bit line has been charged using a low voltage potential. The time TA, as shown in FIGS. 4B and 4C, which is after the voltage potential $V_{BLEQ}$ (corresponding to the mean from the high and low voltage levels VBLH and VBLL) has appeared on the two bit lines, is generally in the range of about 100 ns (nanoseconds).

The charge stored on the coupling capacitances CK when the data topology is unfavorable produces a voltage offset on the bit lines which cannot be eliminated by shorting the bit lines through the first switching transistor ET1 (which is on). This charge can be dissipated only via the transistor for current limiting, which connects the bit line BL and the complementary bit line /BL to the connection A10 for applying the mid-voltage $V_{BLEQ}$. The time TA which is required until the bit line BL and the complementary bit line /BL have been charged to the common voltage level $V_{BLEQ}$ is essentially dependent on the magnitude of the coupling capacitance CK, on the high voltage level VBLH which corresponds to the logic 1 information item and on the resistance of the transistor LT for current limiting.

The resistance of the transistor for current limiting determines the level of the equalization current draining to the connection A10. Its resistance can be altered by the control voltage which is applied to the control connection SL. In the exemplary embodiment in FIG. 3, a fixed internal voltage VINT is connected to the control connection SL of the transistor for current limiting, where the fixed internal voltage corresponds to the threshold voltage of the transistor for current limiting at room temperature (e.g., about 25° C.). When the integrated semiconductor memory device is operated in the low temperature range, the threshold voltage of the transistor for current limiting is generally increased.

If the transistor for current limiting is turned on by actuating its control connection with the constant control signal SL (e.g., the constant control voltage VINT), the transistor is turned on inadequately, particularly at low temperatures. This means that the resistance of the transistor for current limiting is too high to dissipate the charge stored on the coupling capacitance CK to the connection A10 in the prescribed precharging time. The time TA which is needed in order to charge the bit line BL and the complementary bit line /BL to the common voltage potential $V_{BLEQ}$ from the start of the precharging process to the time TP is in this case longer than the available precharging time. Since it is no longer possible to assume the desired equalization potential $V_{BLEQ}$ within the available precharging time, increased failures arise, particularly when the integrated semiconductor memory device is operated at a low temperature. To minimize such failures, the integrated semiconductor memories are currently tested using a coupling-critical data topology and a reduced precharging time. However, the stringent test conditions in turn result in an increased loss of yield during the test phase.

SUMMARY OF THE INVENTION

An object of the invention is to provide an integrated semiconductor memory and a method for operating an integrated semiconductor memory in which the time required for precharging the bit lines is reduced.

In accordance with the present invention, an integrated semiconductor memory device comprises a memory cell array comprising a first bit line and a second bit line, a connection to apply a mid-voltage having a voltage level that ranges from a first voltage potential to a second voltage potential, a first controllable switch, a control unit configured to produce a control signal, and a controllable resistor including a control connection to apply the control signal from the control unit. The first and second bit lines are connected via the controllable resistor to the connection that applies the mid-voltage, the memory cell array is operable in a first operating state and a second operating state, the controllable resistor becomes a low-value resistor in the first operating state of the memory cell array and is operable in a first mode of operation and a second mode of operation, where the controllable resistor has a lower resistance value in the second mode of operation in comparison to the resistance value of the controllable resistor in the first mode of operation, the controllable resistor becomes a high-value resistor in the second operating state of the memory cell array. Also, in the first operating state of the memory cell array, the first controllable switch is on and the first bit line is connected to the second bit line. The control unit is configured such that, during a first time period in the first operating state of the memory cell array, the control unit produces a first control signal that sets the controllable resistor in the first mode of operation. The control unit is further configured such that, during a second time period that is subsequent the first time period in the first operating state of the memory cell array, the control unit produces a second control signal that sets the controllable resistor in the second mode of operation. In addition, the control unit is further configured such that, during a third time period that is subsequent the second time period in the first operating state of the memory cell array, the control unit produces the first control signal that sets the controllable resistor in the first mode of operation.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components

BRIEF DESCRIPTION OF THE DRAWINGS

FIG. 1 depicts a memory cell area, split into individual memory cell arrays, in an integrated semiconductor memory device.

FIG. 2 depicts coupling of a sense amplifier to a first and a second memory cell array.

FIG. 3 depicts a sense amplifier with a circuit for precharging a bit line and a complementary bit line.

DETAILED DESCRIPTION

Figure 4B:
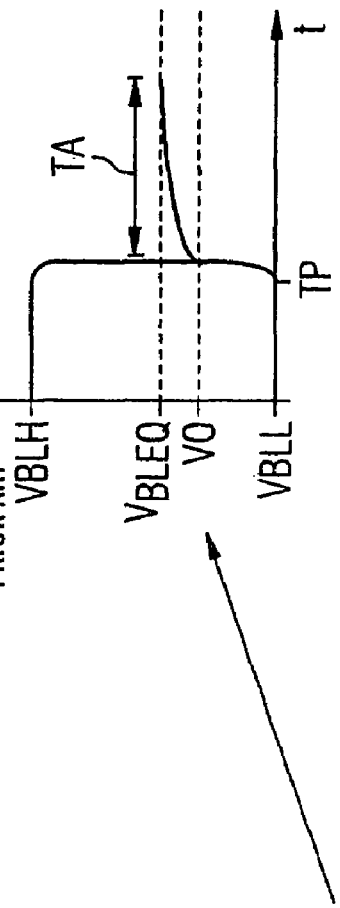
FIG. 4B is a plot of voltage potentials vs. time on a first capacitively coupled bit line pair during a precharging process.

An integrated semiconductor memory device is formed, in accordance with the present invention, and includes a memory cell array with a first bit line and a second bit line, a connection configured to apply a mid-voltage, with the voltage level of the mid-voltage being between a first voltage potential and a second voltage potential. In addition, the integrated semiconductor memory device includes a first controllable switch, a control unit configured to produce a control signal and a controllable resistor including a control connection configured to apply the control signal from the control unit. The first and second bit lines are connected via the controllable resistor to the connection so as to apply the mid-voltage.

The memory cell array is operable in a first operating state and a second operating state. In the first operating state of the memory cell array, the controllable resistor is in the form of a low-value resistor. In the second operating state of the memory cell array, the controllable resistor is in the form of a high-value resistor. In the first operating state of the memory cell array, the controllable resistor is operable in a first mode of operation and a second mode of operation. In the second mode of operation, the controllable resistor is in the form of a resistor that has a lower value than in the first mode of operation. In the first operating state of the memory cell array, the first controllable switch is on, such that the first and second bit lines are connected to each other.

The control unit is configured such that, during a first time period in the first operating state of the memory cell array, the control unit produces a first control signal that sets the controllable resistor in the first mode of operation. In addition, the control unit is configured such that, during a subsequent second time period in the first operating state of the memory cell array, the control unit produces a second control signal that sets the controllable resistor in the second mode of operation. The control unit is also configured such that, during a subsequent third time period in the first operating state of the memory cell array, the control unit produces the first control signal, where the first control signal sets the controllable resistor in the first mode of operation.

The integrated semiconductor memory and the method for operating an integrated semiconductor memory device of the present invention render it possible to reduce the precharging time, particularly even in the presence of capacitive coupling of bit lines (which has an adverse effect on the precharging time) and with a correspondingly critical data topology.

In one embodiment of the invention, the integrated semiconductor memory includes an input connection configured to apply a signal for controlling the integrated semiconductor memory device. In this case, the control unit is connected to the input connection for controlling the integrated semiconductor memory. The control unit is designed such that, when a first state of the signal for controlling the integrated semiconductor memory device is applied, it switches the memory cell array to the first operating state.

In a further embodiment, the integrated semiconductor memory device includes a memory cell with a selection transistor and a storage capacitor. The storage capacitor in the memory cell can be connected to the first bit line by means of the selection transistor. In this embodiment, the control unit is designed such that, when a second state of the signal for controlling the integrated semiconductor memory device is applied, it switches the memory cell array to the second operating state. In the second operating state of the memory cell array the selection transistor in the memory cell is on, which means that the storage capacitor is connected to the first bit line. In the second operating state of the memory cell array the first controllable switch is off, which means that the first bit line is isolated from the second bit line.

In another embodiment of the integrated semiconductor memory device, the control unit is designed such that in the second operating state of the memory cell array it produces a third control signal which sets the controllable resistor to a high resistance.

In still another embodiment of the invention, the control unit is designed such that, during the first time period in the first operating state of the memory cell array, the control unit produces the first control signal during a time of about 5 ns (nanoseconds), which first control signal puts the controllable resistor into the first mode of operation. In addition, the control unit is designed such that, during the subsequent second time period in the first operating state of the memory cell array, the control unit produces the second control signal during a time of about 50 ns to 100 ns, which second control signal puts the controllable resistor into the second mode of operation.

In one embodiment, the integrated semiconductor memory device of the present invention includes an adjustable switch having an actuating connection, a control circuit configured to produce an actuating signal for changing over the adjustable switch, a first voltage generator circuit configured to produce the first control signal and a second voltage generator circuit configured to produce the second control signal. The control circuit has its output connected to the actuating connection of the adjustable switch. The adjustable switch is configured such that, in the first mode of operation of the controllable resistor, the adjustable switch connects the control connection of the controllable resistor to the first voltage generator circuit. In addition, the adjustable switch is configured such that, in the second mode of operation of the controllable resistor, the adjustable switch connects the control connection of the controllable resistor to the second voltage generator circuit.

In a further embodiment of the present invention, the integrated semiconductor memory device includes a third voltage generator circuit configured to produce the third control signal. In this embodiment, the adjustable switch is designed such that, in the second operating state of the memory cell array, the adjustable switch connects the control connection of the controllable resistor to the third voltage generator circuit.

The controllable resistor can be in the form of a transistor for current limiting.

Further, the first voltage generator circuit can be configured such that it produces the first control signal with a voltage level which corresponds to the threshold voltage of the transistor for current limiting. The second voltage generator circuit is configured such that it produces the second control signal with a voltage level whose magnitude is above the threshold voltage of the transistor for current limiting. In addition, the third voltage generator circuit is configured such that it produces the third control signal with a voltage level whose magnitude is below the threshold voltage of the transistor for current limiting.

In one preferred embodiment, the first voltage generator circuit is configured such that it produces the first control signal with a voltage level between 1.8 V and 2.0 V. In addition, the second voltage generator circuit is configured such that it produces the second control signal with a voltage level between 2.7 V and 3.0 V.

In another embodiment, the integrated semiconductor memory device includes a fourth voltage generator circuit configured to produce the mid-voltage. In this embodiment, the fourth voltage generator circuit is connected to the connection for applying the mid-voltage.

The integrated semiconductor memory device can further include a second controllable switch and a third controllable switch. In this embodiment, the first bit line is connected to the controllable resistor via the second controllable switch in the first operating state of the memory cell array, while the second bit line is connected to the controllable resistor via the third controllable switch in the first operating state of the memory cell array.

The first, second and third controllable switches can each be in the form of a switching transistor.

The second voltage generator circuit can be a charge pump that produces an output voltage which is higher than its supply voltage.

The first, third and fourth voltage generator circuits can each be a circuit for voltage stabilization.

In another embodiment of the invention, the first, second and third switching transistors are operated in an off condition in the second operating state of the memory cell array.

In addition, the first bit line can be charged to the first voltage potential in the second operating state of the memory cell array, and the second bit line can be charged to the second voltage potential in the second operating state of the memory cell array. In an exemplary embodiment, the first voltage potential has a high voltage level, while the second voltage potential has a low voltage level (i.e., lower than the high voltage level of the first voltage potential).

An exemplary method for operating one or more of the integrated semiconductor memory devices of the invention as described above is provided as follows. The fourth voltage generator circuit produces the mid-voltage with a voltage level between the first and second voltage potentials on the connection for applying the mid-voltage. The memory cell array is switched to the operating state by applying the second state of the second signal for controlling the integrated semiconductor memory device to the input connection of the integrated semiconductor memory device. The first bit line is charged to the first voltage potential, and the second bit line is charged to the second voltage potential. By applying the first state of the signal for controlling the integrated semiconductor memory device to the input connection of the integrated semiconductor memory device, the memory cell array is then switched to the first operating state. The first, second and third controllable switches are turned on. During the first time period the controllable resistor is put into a low-value first resistance range. During the subsequent second time period the controllable resistor is put into a low-value second resistance range, the second resistance range being in the form of a lower-value resistance range than the first resistance range. During the subsequent third time period the controllable resistor is put back into the first resistance range.

In one embodiment of the method described above, during a first time period with a duration of about 5 ns, the controllable resistor is put into the low-value first resistance range. During a subsequent second time period with a duration of about 50 ns to 100 ns, the controllable resistor is put into the low-value second resistance range, the second resistance range being in the form of a lower-value resistance range than the first resistance range.

In addition, during the first time period in the first operating state of the memory cell array, the first control signal can be produced by the first control unit in order to put the controllable resistor into the first resistance range. During the subsequent second time period in the first operating state of the memory cell array, the second control signal can be produced by the first control unit in order to put the controllable resistor into the second resistance range. During the subsequent third time period in the first operating state of the memory cell array, the first control signal can be produced by the first control unit in order to put the controllable resistor into the first resistance range.

Further, the third control signal can be produced by the first control unit in the second operating state of the memory cell array in order to put the controllable resistor into the high-resistance range.

In a further embodiment of the method for operating the integrated semiconductor memory device of the present invention, the first control signal can be produced by the first voltage generator circuit. The second control signal can be produced by the second voltage generator circuit, and the third control signal can be produced by the third voltage generator circuit. The actuating signal for changing over the adjustable switch can be produced by the control circuit. In a preferred embodiment, the first control signal is produced by the first voltage generator circuit with a voltage level between 1.8 V and 2.0 V, and the second control signal is produced by the second voltage generator circuit with a voltage level between 2.7 V and 3.0 V.

In still another embodiment of the method for operating the integrated semiconductor memory device of the present invention, during the first time period in the first operating state of the memory cell array, the adjustable switch is switched to a first switching state in which the control connection of the controllable resistor is connected to the first voltage generator circuit. During the subsequent second time period in the first operating state of the memory cell array, the adjustable switch is switched to a second switching state in which the control connection of the controllable resistor is connected to the second voltage generator circuit. During the subsequent third time period in the first operating state of the memory cell array, the adjustable switch is switched to the first switching state, in which the control connection of the controllable resistor is connected to the first voltage generator circuit.

The second operating state of the memory cell array the adjustable switch can be switched to a third switching state in which the control connection of the controllable resistor is connected to the third voltage generator circuit.

In the second operating state of the memory cell array, it is possible to read an information item stored in the memory cell of the memory cell array. Similarly, in the second operating state of the memory cell array, it is possible to write an information item to the memory cell of the memory cell array.

Figure 5:
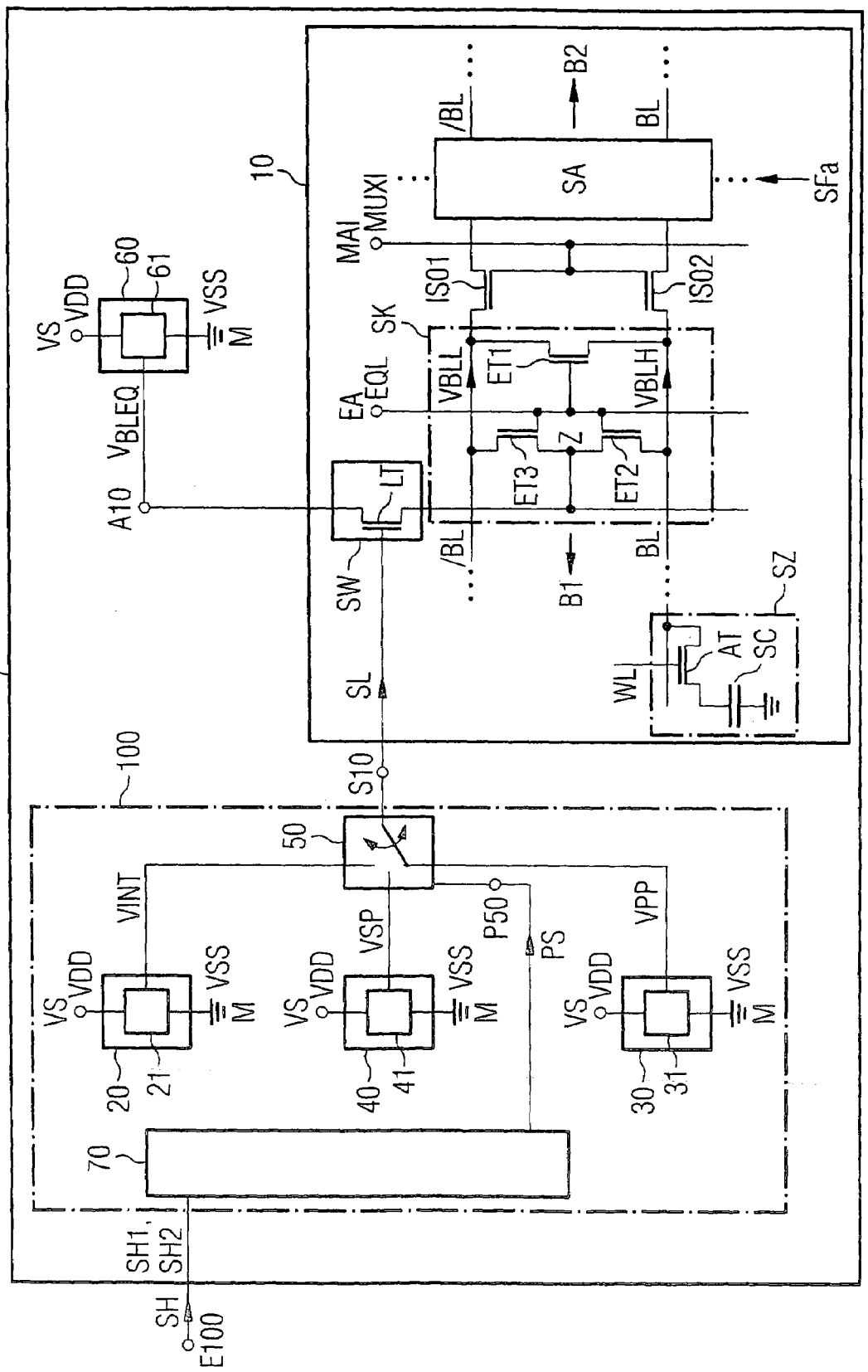
FIG. 5 depicts an integrated semiconductor memory device in accordance with the present invention.

An exemplary embodiment of an integrated semiconductor memory device, which reduces the time for precharging bit lines, is depicted in FIG. 5. In particular, an integrated semiconductor memory device 1000 includes an input connection E100 to apply a signal for putting or setting the integrated semiconductor memory device into a first and a second operating state. Device 1000 also includes a memory cell area 10 and a control unit 100 for producing a control signal SL. The control unit 100 contains a first voltage generator circuit 20 for producing a control voltage VINT, a second voltage generator circuit 30 for producing a control voltage VPP, a third voltage generator circuit 40 for producing a control voltage VSP, an adjustable switch 50 including an actuating connection P50, and a control circuit 70. In addition, the integrated semiconductor memory device 1000 includes a fourth voltage generator circuit 60 for producing a mid-voltage $V_{BLEQ}$. The voltage generator circuits 20, 30, 40 and 60 each include a connection VS for applying a supply voltage VDD and a connection M for applying a ground potential VSS. For reasons of better clarity, one sense amplifier SA, situated in a sense amplifier strip SFa, is shown within the memory cell area 10. Both sides of the sense amplifier SA are connected to bit lines BL and complementary bit lines /BL in a first memory cell array B1 and in a second memory cell array B2. The circuit components shown on the left-hand side of the sense amplifier SA correspond with and function in a similar manner as the circuit components described above and depicted in FIG. 3. The bit line BL in the first memory cell array B1 has a memory cell connected to it which corresponds to the DRAM memory cell described above and depicted FIG. 2. The circuit component SK, which is used during the precharging process to equalize the voltage potential of the bit line pair BL and /BL, is connected via the current limiter transistor LT to the connection A10 for applying the mid-voltage $V_{BLEQ}$. The mid-voltage $V_{BLEQ}$ is produced by the fourth voltage generator circuit 60 as a stabilized voltage derived from the supply voltage VDD.

In one exemplary embodiment, the fourth voltage generator circuit 60 is in the form of a circuit for voltage stabilization 61. The output of the first voltage generator circuit 20 produces the stable control voltage VINT, which is derived from the supply voltage VDD applied to its supply connection VS. In another exemplary embodiment, the first voltage generator circuit 20 is in the form of a circuit for voltage stabilization 21. In still another exemplary embodiment, the third voltage generator circuit 40 is in the form of a circuit for voltage stabilization 41.

The output of the second voltage generator circuit 30 produces the control voltage VPP, which is derived from the supply voltage VDD applied to its supply connection VS. Since the control voltage VPP is preferably above the supply voltage VDD for the integrated semiconductor memory device, the second voltage generator circuit 30 is preferably in the form of a charge pump 31. The output of the third voltage generator circuit 40 produces the stable control voltage VSP, which is derived from the supply voltage VDD applied to its supply connection VS.

The control voltage VINT, the control voltage VPP and the control voltage VSP can be supplied to the control connection S10 of the current limiter transistor LT via the adjustable switch 50. In a first switching state, the adjustable switch 50 connects the control connection S10 of the current limiter transistor LT to the first voltage generator circuit 20 for producing the control voltage VINT. In a second switching state, the adjustable switch 50 connects the control connection S10 of the current limiter transistor LT to the second voltage generator circuit 30 for producing the control voltage VPP. In a third switching state, the adjustable switch 50 connects the control connection S10 of the current limiter transistor LT to the third voltage generator circuit 40 for producing the control voltage VSP. The adjustable switch 50 is put into the first, second and third switching states by applying an actuating signal PS to the actuating connection P50, where the signal PS is produced by the control circuit 70.

Figure 6A:
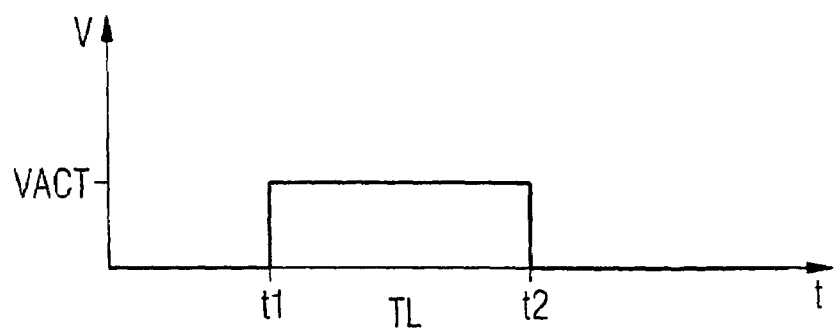
FIG. 6A is a plot of a voltage potential vs. time on a word line for activating a memory cell in accordance with the present invention.

Operation of the inventive integrated semiconductor memory device 1000 is explained in detail below with reference to FIGS. 6A to 6D, which depict voltage/time graphs or plots. In particular, FIG. 6A shows the voltage potential on the word line WL connected to the control connection of the selection transistor AT in the memory cell SZ from FIG. 5. At the time t1, the word line WL has the potential VACT applied to it in order to activate the memory cell SZ. When the time TL has elapsed, at the time t2, the potential on the word line WL is put back to a low voltage level, for example 0V, so that the selection transistor AT, for example formed by the n-channel type, in the memory cell SZ is turned off. During the time TL, the content of the memory cell SZ is read.

Figure 6B:
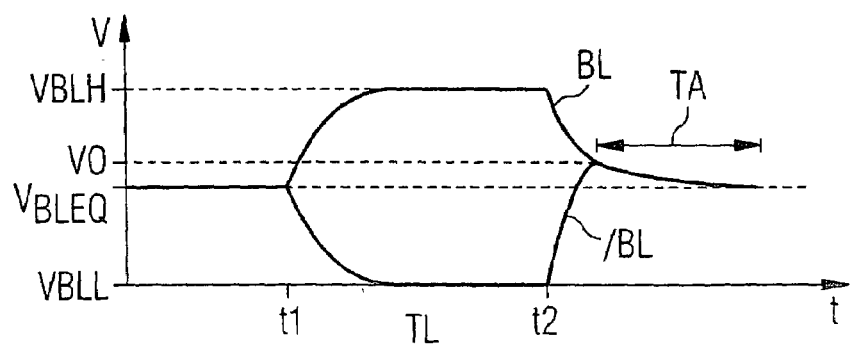
FIG. 6B is a plot of voltage potentials vs. time on a bit line pair during a read access operation and a precharging process in accordance with the present invention.

FIG. 6B shows the voltage potential on the bit line BL before, during and after a read access operation to the memory cell SZ. Before the read access operation, the bit lines BL and the complementary bit line /BL are charged to the common voltage potential $V_{BLEQ}$ up to the time t1. This state corresponds to a first operating state of the memory cell array and can be activated by applying a first state of the signal SH1 for controlling the integrated semiconductor memory device.

At the time t1, the read access operation to the memory cell SZ takes place as a result of the word line being activated with the voltage VACT. Assuming that a logic 1 information item has been stored in the memory cell SZ, the potential on the bit line BL rises to the high voltage level VBLH, for example the voltage level 1.5 V, which corresponds to the logic 1 state. The voltage potential on the complementary bit line /BL assumes the low voltage level VBLL, for example the voltage level 0 V, which corresponds to the logic 0 information item. While the memory cell information is being read, the current limiter transistor LT needs to be turned off. To this end, the control circuit 70 produces the actuating signal PS at the actuating connection P50 of the adjustable switch 50, which means that the adjustable switch 50 connects the control connection S10 of the current limiter transistor LT to the third voltage generator circuit 40 for producing the control voltage VSP. At the same time, the switching transistors ET1, ET2 and ET3 are turned off by applying an appropriate control signal EQL to the control connection EA of the circuit component SK. As a result, the bit line BL and the complementary bit line /BL are no longer shorted together and are also no longer connected to the fourth voltage generator circuit 60 for producing the mid-voltage $V_{BLEQ}$. This state of the memory cell array corresponds to a second operating state of the memory cell array and can be activated by applying a second state of the signal SH2 for controlling the integrated semiconductor memory device.

The fall in the voltage level shown in FIG. 6A on the word line WL at the time t2 turns off the selection transistor AT in the memory cell SZ again. The bit line BL and the complementary bit line /BL are now in the deactivated state. In order to reassess a memory cell which is connected to the bit line BL after a short time, the bit line pair BL and /BL need to be charged to a common equalization potential as quickly as possible. This makes it possible to prevent a subsequent read or write access operation from being influenced by the previous potential state on the bit lines. In this case, the equalization potential is between a high voltage level VBLH, which corresponds to the logic 1 information item, and a low voltage level VBLL, which corresponds to the logic 0 information item. Preferably, it is in the form of the arithmetic mean from the high voltage level VBLH and the low voltage level VBLL. The control circuit 70 produces a control signal PS for controlling the adjustable switch 50 at the time t2, which means that the control connection S10 of the current limiter transistor LT is connected to the first voltage generator circuit 20 for producing the control voltage VINT. At the same time, applying the control signal EQL to the control connection EA of the circuit component SK turns on the switching transistors ET1, ET2 and ET3. The first switching transistor ET1 shorts the bit line BL and the complementary bit line /BL. The bit line BL is connected via the second switching transistor ET2 and the current limiter transistor LT to the fourth voltage generator circuit 60 for producing the mid-voltage $V_{BLEQ}$. The complementary bit line /BL is connected via the third switching transistor ET3 and the current limiter transistor LT likewise to the fourth voltage generator circuit 60 for producing the mid-voltage $V_{BLEQ}$. This state of the memory cell array corresponds to the first operating state of the memory cell array.

As a result of the capacitive coupling of the bit line BL and of the bit line /BL to adjacent bit line pairs, the equalization potential on the bit line pair first assumes a voltage level VO which is above the desired equalization potential $V_{BLEQ}$. The desired equalization potential corresponds to the mid-voltage potential $V_{BLEQ}$ provided by the fourth voltage generator circuit 60. Only when the time TA, which is generally in the range of about 100 ns, has elapsed has the potential on the two bit lines BL and /BL assumed the desired voltage value $V_{BLEQ}$.

Figure 6C:
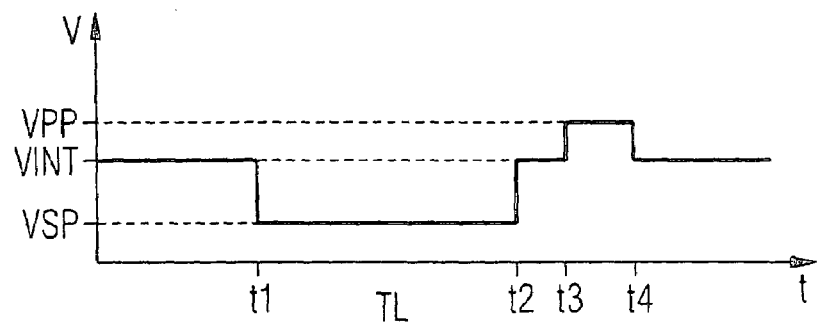
FIG. 6C is a plot of control voltages vs. time for actuating the transistor for current limiting during a read access operation and a precharging process in accordance with the present invention.
Figure 6D:
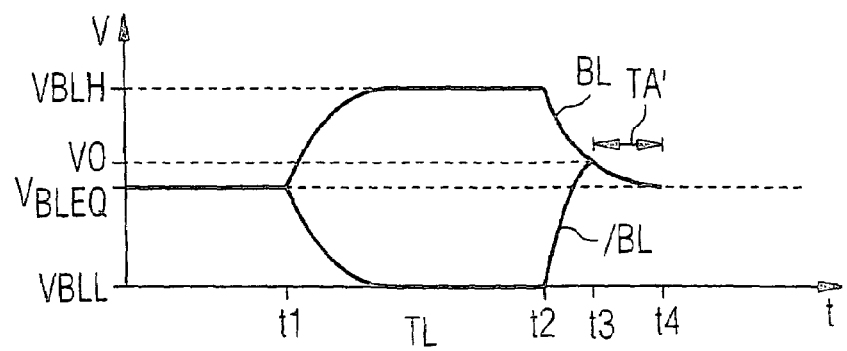
FIG. 6D is a plot of voltage potentials vs. time on a bit line pair during a read access operation and a precharging process in accordance with the present invention.

FIG. 6C shows the profile of the control voltage on the control connection SL of the current limiter transistor LT in line with the invention. FIG. 6D shows the profile of the voltage potentials on the bit line BL and on the complementary bit line /BL before, during and after a read access operation, with the current limiter transistor LT in this case being actuated using the control voltages shown in FIG. 6C.

Before the read access operation to the memory cell SZ at the time t1, the two bit lines BL and /BL are charged to the common equalization potential $V_{BLEQ}$. This state corresponds to the first operating state of the memory cell array and can be activated by applying a first state of the signal SH1 for controlling the integrated semiconductor memory device.

At the time t1, the word line WL connected to the selection transistor AT in the memory cell SZ is activated, which means that the memory cell SZ is conductively connected to the bit line BL. Assuming, as already in the example in FIG. 6B, that the memory cell SZ stores a logic 1 information item, the potential on the bit line BL rises to the high voltage level VBLH, for example 1.5 V, and the voltage potential on the complementary bit line /BL assumes the low voltage level VBLL, for example 0V. While the memory cell information is being read, the current limiter transistor LT needs to be turned off. To this end, the control circuit 70 produces the actuating signal PS on the actuating connection P50 of the adjustable switch 50, which means that the adjustable switch 50 connects the control connection SL of the current limiter transistor LT to the third voltage generator circuit 40 for producing the reverse voltage VSP. At the same time, the switching transistors ET1, ET2 and ET3 are turned off by applying an appropriate control signal EQL to the control connection EA of the circuit component SK. The bit line BL and the complementary bit line /BL are therefore no longer shorted together and are also no longer connected to the voltage generator circuit 60 for producing the mid-voltage $V_{BLEQ}$. This state of the memory cell array corresponds to the second operating state of the memory cell array and can be activated by applying a second state of the signal SH2 for controlling the integrated semiconductor memory device. At the time t2, the voltage potential VACT on the word line WL falls again, as a result of which the selection transistor AT in the memory cell SZ is turned off.

Following the read access operation, the bit lines BL and /BL, which have been charged to the voltage levels VBLH and VBLL, need to be charged to a common equalization potential $V_{BLEQ}$ again. To this end, the current limiter transistor LT is turned on again at the time t2. To do this, the control circuit 70 produces the actuating signal PS, which means that the adjustable switch 50 connects the control connection SL of the current limiter transistor to the voltage generator circuit 20 for producing the control voltage VINT. At the same time, the control signal EQL is applied to the control connection EA of the circuit component SK, which means that the switching transistors ET1, ET2 and ET3 are turned on. The first switching transistor ET1, which is on, shorts the two bit lines BL and /BL. The bit line BL is connected via the second switching transistor ET2 and the current limiter transistor LT to the fourth voltage generator circuit 60 for producing the mid-voltage $V_{BLEQ}$. Similarly, the complementary bit line /BL is connected via the third switching transistor ET3, which is on, and the current limiter transistor LT to the fourth voltage generator circuit 60 for producing the mid-voltage $V_{BLEQ}$. This operating state corresponds to the first operating state of the memory cell array.

Figure 4C:
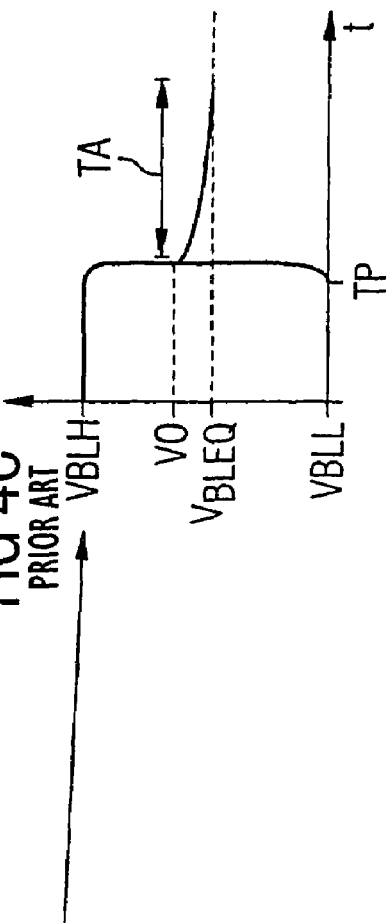
FIG. 4C is a plot of voltage potentials vs. time on a second capacitively coupled bit line pair during a precharging process.
Figure 4A:
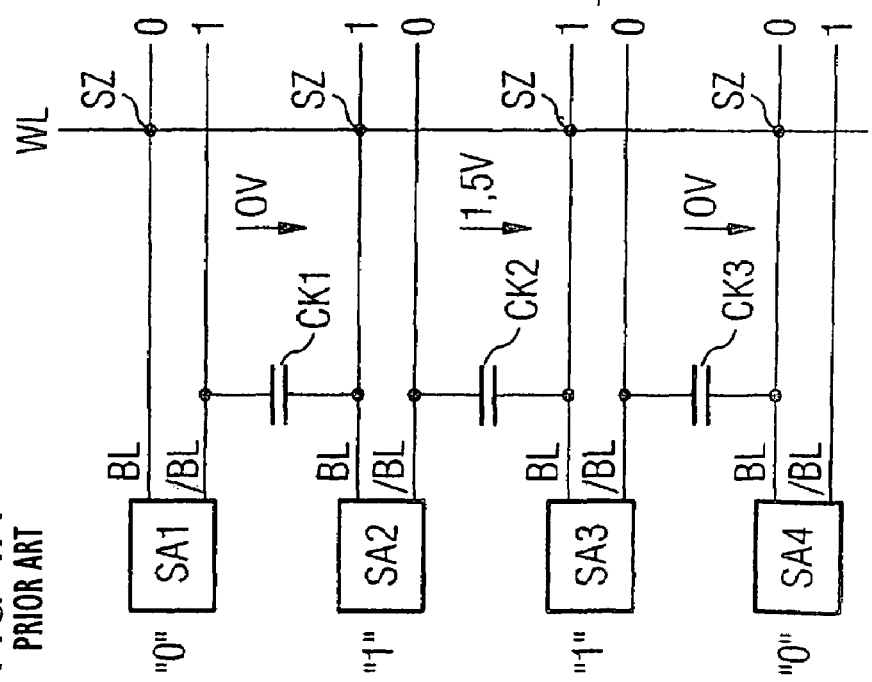
FIG. 4A depicts four capacitively coupled bit line pairs in a memory cell array.

On account of the capacitive coupling of the bit lines BL and /BL to adjacent bit lines, however, the potential which has appeared on the two bit lines at the time t3 is not the desired equalization potential $V_{BLEQ}$, but rather a voltage potential VO which is above the mid-voltage $V_{BLEQ}$. As already explained with reference to FIGS. 4A to 4C, the voltage offset is produced by a charge which is present on a parasitic coupling capacitor CK between adjacent bit lines. To speed up the dissipation of this charge to the connection A10 for applying the mid-voltage $V_{BLEQ}$, the current limiter transistor LT is briefly set to a low resistance from the time t3 to the time t4, as depicted in FIG. 6C. To this end, the control circuit 70 produces the actuating signal PS, which means that the adjustable switch 50 connects the control connection SL of the current limiter transistor LT briefly to the charge pump 31. The output of the charge pump 31 produces the control voltage VPP, which is above the control voltage VINT produced by the first voltage generator circuit 20. If the current limiter transistor LT is in the form of a transistor of the n-channel type, for example, the controllable path of this transistor is set to a low resistance between the times t3 and t4. This has the advantage that the charge which is present on a parasitic coupling capacitor which is connected to the bit line pair BL and /BL and which capacitively couples the bit line pair BL and /BL to an adjacent bit line pair can be dissipated more quickly to the connection A10 for applying the mid-voltage $V_{BLEQ}$. When the time TA' has elapsed, the desired equalization potential $V_{BLEQ}$ has appeared on the two bit lines BL and /BL again.

As becomes clear from a comparison of FIGS. 6B and 6D, the time TA' required to assume the desired equalization potential $V_{BLEQ}$ as a result of the brief actuation of the current limiter transistor LT is significantly reduced with a higher control voltage pulse. The increased control voltage pulse VPP is preferably in an order of magnitude between 2.7 V and 3.0 V.

When the voltage potential on the bit line BL and the complementary bit line /BL has assumed the desired equalization potential $V_{BLEQ}$ after the time TA' has elapsed, the current limiter transistor LT is actuated using the control voltage VINT again at the time t4.

So that an excessive equalization current does not flow via the current limiter transistor at the start of the precharging process, the current limiter transistor LT is actuated by the control voltage VINT, which corresponds to the threshold voltage of the current limiter transistor or is slightly above this threshold voltage, from the time t2 to the time t3. In this case, the resistance of the transistor LT is sufficiently high so as to limit the equalization current and not to overload the charge pump 31. The transistor acts as a current limiter. The control voltage VINT is preferably in an order of magnitude between 1.8 and 2.0 V.

Figure 7:
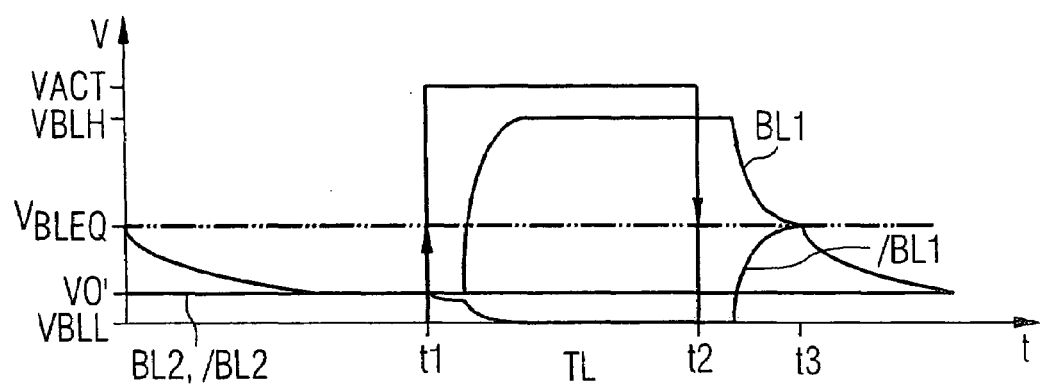
FIG. 7 is a plot of voltage potentials vs. time that shows the influence of a sound bit line pair by a shorted bit line pair during a precharging process in accordance with the present invention.

Referring to FIG. 7, the following method explains how to select the duration of the control voltage pulse VPP so as to set the current limiter transistor LT to a low resistance for a brief time period. FIG. 7 shows the voltage/time plot for a bit line pair containing the bit lines BL1 and /BL1 before, during and after a read access operation. The voltage/time plot in FIG. 7 likewise shows the voltage potential on a second bit line pair containing the bit lines BL2 and /BL2. The two bit line pairs are connected to the same current limiter transistor. The bit line pair BL2 and /BL2 is a faulty bit line pair which assumes a voltage potential below the desired equalization potential $V_{BLEQ}$ during the entire period shown. For example, the faulty bit lines BL2 and /BL2 are bit lines which are affected by a low-resistance short circuit.

A low-resistance short circuit frequently occurs between a bit line and, by way of example, a line which has a negative voltage potential with respect to ground, which negative voltage potential is used to turn off a selection transistor in a memory cell. Low-resistance leakage paths likewise arise between individual bit lines or between a bit line and the substrate.

Since the bit line pair containing the bit lines BL1 and /BL1 and also the bit line pair containing the bit lines BL2 and /BL2 are connected to the voltage generator 60 via the same current limiter transistor, they influence one another. Before the read access operation at the time t1, the sound bit lines BL1 and /BL1 are therefore charged to an equalization potential VO' which is below the desired equalization potential $V_{BLEQ}$.

At the time t1, a read access operation is performed to a memory cell which is connected to the bit line BL1. To this end, the potential on the word line which actuates the selection transistor in the corresponding memory cell is charged to the voltage potential VACT. The selection transistor in the memory cell is turned on as a result, which means that the charge which is present on the storage capacitor in the memory cell alters the potential of the bit line BL1. Assuming that the memory cell stores a logic 1 information item, the potential on the bit line BL1 rises after the time t1 to the high voltage level VBLH (e.g., 1.5 V). The potential on the complementary bit line /BL1 assumes the low voltage level VBLL (e.g., 0 V).

At the time t2, the reading process is finished. The voltage level on the word line falls to 0 V again. This means that the selection transistor in the memory cell SZ is off again, so that the memory cell is no longer conductively connected to the bit line BL1. After the time t2, the precharging process for equalizing the voltage potential on the bit line BL1 and the complementary bit line /BL1 starts. To this end, the current limiter transistor LT is actuated with the control voltage VINT, which turns it on. The switching transistors ET1, ET2 and ET3 are actuated with the control voltage EQL, which puts them into the conductive state. The bit line BL1 and the complementary bit line /BL1 are consequently connected to the connection for applying the mid-voltage $V_{BLEQ}$ again via the second and third switching transistors ET2 and ET3, which are on, and are shorted together via the first switching transistor ET1. At the time t3, the desired equalization potential $V_{BLEQ}$ has appeared on both bit lines, where the equalization potential corresponds to the mid-voltage that is produced by the fourth voltage generator circuit 60. The current drawn by the faulty bit lines BL2 and /BL2 from the $V_{BLEQ}$ supply is very large on account of the low-resistance short circuit, for example to a ground potential. The current limiter transistor limits this current, and a potential between $V_{BLEQ}$ and the ground potential appears for both bit line pairs. On account of the capacitive coupling to the faulty bit line pair BL2 and /BL2, however, the mid-voltage level $V_{BLEQ}$ assumed falls again at the time t3 and, after a short time, assumes the voltage level VO' on the bit line BL2 and on the complementary bit line /BL2.

In accordance with the present invention, the current limiter transistor LT is briefly set to a low resistance by applying the control voltage pulse VPP at the time t3. If the control voltage pulse for controlling the current limiter transistor LT lasts too long, a large current flows via the current limiter transistor after the time t3, which means that the fourth voltage generator circuit for producing the mid-voltage $V_{BLEQ}$ is overloaded. The influence on the bit lines BL1 and /BL1 by the shorted bit lines BL2 and /BL2 means that the bit lines BL1 and /BL1 draw too much current from the fourth voltage generator circuit 60 in this case. It turns out that the generator capacitance in the fourth voltage generator circuit 60 can compensate for the large current drawn for a period between 50 ns and 100 ns. It is therefore preferred that the current limiter transistor be set to a low resistance for a period which is between 50 and 100 ns.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST O REFERENCE SYMBOLS

10 Memory cell area
20 Voltage generator circuit
21 Circuit for voltage stabilization
30 Voltage generator circuit 31 Charge pump
40 Voltage generator circuit
41 Circuit for voltage stabilization
50 Adjustable switch
60 Voltage generator circuit
61 Circuit for voltage stabilization
70 Control circuit
100 Control unit
A10 Connection for applying the mid-voltage
AT Selection transistor
B Memory cell array
BL Bit line
EA Control connection for actuating the switching transistors
EQL Control signal for controlling the switching transistor
ET Switching transistor
IES Circuit detail from the equalization circuit for potential equalization
ISO Isolating transistor
LT Transistor for current limiting
M Reference potential connection
MA Control connection of the isolating transistor
MUX Control signal for activating a memory cell array
P50 Actuating connection
PS Actuating signal
SA Sense amplifier
SC Storage capacitor
SF Sense amplifier strip
SH Signal for controlling the integrated semiconductor memory device
SK Circuit component
SL Control connection of the transistor for current limiting
SSA Circuit detail from the memory cell array
SW Controllable resistor
SZ Memory cell
TA Requisite period of time for charging the bit lines to the mid-voltage
TL Period of time for a read access operation
TP Time for activating a potential equalization operation
VACT Activation signal from the word line
$V_{BLEQ}$ Mid-voltage
VBLH High voltage level
VBLL Low voltage level
VDD Supply potential
VINT First control signal
VO Offset voltage
VPP Second control signal
VS Connection for applying the supply potential
VSP Third control signal
VSS Ground potential
WL Word line

What is claimed is:

1. An integrated semiconductor memory device comprising:
a memory cell array comprising a first bit line and a second bit line;
a connection to apply a mid-voltage having a voltage level that ranges from a first voltage potential to a second voltage potential;
a first controllable switch;
a control unit configured to produce a control signal; and
a controllable resistor including a control connection to apply the control signal from the control unit;
wherein:
the first and second bit lines are connected via the controllable resistor to the connection that applies the mid-voltage;
the memory cell array is operable in a first operating state and a second operating state;
the controllable resistor becomes a low-value resistor in the first operating state of the memory cell array and is operable in a first mode of operation and a second mode of operation, where the controllable resistor has a lower resistance value in the second mode of operation in comparison to a resistance value of the controllable resistor in the first mode of operation;
the controllable resistor becomes a high-value resistor in the second operating state of the memory cell array;
in the first operating state of the memory cell array, the first controllable switch is on and the first bit line is connected to the second bit line;
the control unit is configured such that, during a first time period in the first operating state of the memory cell array, the control unit produces a first control signal that sets the controllable resistor in the first mode of operation;
the control unit is further configured such that, during a second time period that is subsequent the first time period in the first operating state of the memory cell array, the control unit produces a second control signal that sets the controllable resistor in the second mode of operation; and
the control unit is further configured such that, during a third time period that is subsequent the second time period in the first operating state of the memory cell array, the control unit produces the first control signal that sets the controllable resistor in the first mode of operation.

2. The integrated semiconductor memory device of claim 1, further comprising:
an input connection to apply an input signal to the control unit so as to control the integrated semiconductor memory device, wherein the control unit is further configured such that, when the input signal is applied in a first state, the control unit switches the memory cell array to the first operating state.

3. The integrated semiconductor memory device of claim 2, further comprising:
a memory cell including a selection transistor and a storage capacitor, the storage capacitor in the memory cell being connectable to the first bit line by the selection transistor;
wherein:
the control unit is further configured such that, when the input signal is applied in a second state, the control unit switches the memory cell array to the second operating state;
in the second operating state of the memory cell array, the selection transistor in the memory cell is on, such that the storage capacitor in the memory cell is connected to the first bit line; and
in the second operating state of the memory cell array, the first controllable switch is off, such that the first bit line is isolated from the second bit line.

4. The integrated semiconductor memory device of claim 3, wherein the control unit is further configured such that, in the second operating state of the memory cell array, the control unit produces a third control signal that sets the controllable resistor to a high resistance.

5. The integrated semiconductor memory device of claim 1, wherein:
the control unit is further configured such that, during the first time period in the first operating state of the memory cell array, the control unit produces the first control signal during a time period of about 5 ns; and the control unit is further configured such that, during the second time period in the first operating state of the memory cell array, the control unit produces the second control signal during a time of about 50 ns to about 100 ns.

6. The integrated semiconductor memory device of claim 1, further comprising:

an adjustable switch including an actuating connection;

a control circuit configured to produce an actuating signal that controls the adjustable switch;

a first voltage generator circuit configured to produce the first control signal; and a second voltage generator circuit configured to produce the second control signal;

wherein:

the control circuit includes an output connected to the actuating connection of the adjustable switch;

the adjustable switch is configured such that, in the first mode of operation of the controllable resistor, the adjustable switch connects the control connection of the controllable resistor to the first voltage generator circuit; and the adjustable switch is further configured such that, in the second mode of operation of the controllable resistor, the adjustable switch connects the control connection of the controllable resistor to the second voltage generator circuit.

7. The integrated semiconductor memory device of claim 6, further comprising a third voltage generator circuit configured to produce a third control signal, wherein the adjustable switch is further configured such that, in the second operating state of the memory cell array, the adjustable switch connects the control connection of the controllable resistor to the third voltage generator circuit.

8. The integrated semiconductor memory device of claim 1, wherein the controllable resistor includes a transistor for current limiting.

9. The integrated semiconductor memory device of claim 7, wherein the first voltage generator circuit is configured such that the first voltage generator circuit produces the first control signal with a voltage level that corresponds to a threshold voltage of the transistor for current limiting, the second voltage generator circuit is configured such that the second voltage generator circuit produces the second control signal with a voltage level that is greater than the threshold voltage of the transistor for current limiting, and the third voltage generator circuit is configured such that the third voltage generator circuit produces the third control signal with a voltage level that is less than the threshold voltage of the transistor for current limiting.

10. The integrated semiconductor memory device of claim 9, wherein the first voltage generator circuit is further configured such that the first voltage generator circuit produces the first control signal with a voltage level between 1.8 V and 2.0 V, and the second voltage generator circuit is further configured such that the second voltage generator circuit produces the second control signal with a voltage level between 2.7 V and 3.0 V.

11. The integrated semiconductor memory device of claim 10, further comprising a fourth voltage generator circuit configured to produce the mid-voltage, wherein the fourth voltage generator circuit is connected to the connection that applies the mid-voltage.

12. The integrated semiconductor memory device of claim 11, further comprising:

a second controllable switch; and a third controllable switch;

wherein the first bit line is connected to the controllable resistor via the second controllable switch in the first operating state of the memory cell array, and the second bit line is connected to the controllable resistor via the third controllable switch in the first operating state of the memory cell array.

13. The integrated semiconductor memory device of claim 12, wherein the first, second and third controllable switches are each in the form of a switching transistor.

14. The integrated semiconductor memory device of claim 6, wherein the second voltage generator circuit comprises a charge pump that produces an output voltage that is higher than its supply voltage.

15. The integrated semiconductor memory device of claim 11, wherein the first, third and fourth voltage generator circuits are each in the form of a circuit for voltage stabilization.

16. The integrated semiconductor memory device of claim 12, wherein, in the second operating state of the memory cell array, the first, second and third controllable switches are operated in an off condition.

17. The integrated semiconductor memory device of claim 1, wherein the first bit line is charged to the first voltage potential in the second operating state of the memory cell array, and the second bit line is charged to the second voltage potential in the second operating state of the memory cell array.

18. The integrated semiconductor memory device of claim 1, wherein the first voltage potential is a voltage potential having a high voltage level, and the second voltage potential is a voltage potential having a low voltage level that is less than the high voltage level.

19. A method for operating an integrated semiconductor memory device as recited in claim 12, comprising:

producing the mid-voltage, via the fourth voltage generator circuit, with a voltage level between the first and second voltage potentials on the connection for applying the mid-voltage;

switching the memory cell array to the second operating state by applying a second state of the signal for controlling the integrated semiconductor memory device to the input connection of the integrated semiconductor memory device;

charging the first bit line to the first voltage potential;

charging the second bit line to the second voltage potential;

switching the memory cell array to the first operating state by applying a first state of the signal to control the integrated semiconductor memory device to the input connection of the integrated semiconductor memory device, turning on the first, second and third controllable switches;

during the first time period, setting the controllable resistor to a low-value first resistance range;

during the second time period, setting the controllable resistor to a low-value second resistance range, the low-value second resistance range being less than the low-value first resistance range; and during the subsequent third time period, setting the controllable resistor to the first low-value resistance range.

20. The method of claim 19, further comprising:

during a first time period with a duration of about 5 ns, setting the controllable resistor to the low-value first resistance range; and during the second time period with a duration of about 50 ns to 100 ns, setting the controllable resistor to the low-value second resistance range.

21. The method of claim 19, further comprising:

during the first time period in the first operating state of the memory cell array, producing the first control signal via the control unit in order to set the controllable resistor to the low-value first resistance range;

during the second time period in the first operating state of the memory cell array, producing the second control signal via the control unit in order to set the controllable resistor to the low-value second resistance range; and during the subsequent third time period in the first operating state of the memory cell array, producing the first control signal via the control unit in order to set the controllable resistor to the low-value first resistance range.

22. The method of claim 19, further comprising:

producing the third control signal via the control unit in the second operating state of the memory cell array in order to set the controllable resistor to a high-resistance range.

23. The method of claim 19, further comprising:

producing the first control signal via the first voltage generator circuit;

producing the second control signal via the second voltage generator circuit;

producing the third control signal via the third voltage generator circuit; and producing the actuating signal for controlling the adjustable switch (50) via the control circuit (70).

24. The method of claim 23, further comprising:

producing the first control signal via the first voltage generator circuit with a voltage level between 1.8 V and 2.0 V; and producing the second control signal via the second voltage generator circuit with a voltage level between 2.7 V and 3.0 V.

25. The method of claim 19, further comprising:

during the first time period in the first operating state of the memory cell array, switching the adjustable switch to a first switching state such that the control connection of the controllable resistor is connected to the first voltage generator circuit;

during the second time period in the first operating state of the memory cell array, switching the adjustable switch to a second switching state such that the control connection of the controllable resistor is connected to the second voltage generator circuit; and during the third time period in the first operating state of the memory cell array, switching the adjustable switch to the first switching state such that the control connection of the controllable resistor is connected to the first voltage generator circuit.

26. The method of claim 19, further comprising:

in the second operating state of the memory cell array, switching the adjustable switch to a third switching state such that the control connection of the controllable resistor is connected to the third voltage generator circuit.

27. The method of claim 19, further comprising:

in the second operating state of the memory cell array, reading an information item stored in a memory cell of the memory cell array.

28. The method of claim 19, further comprising:

in the second operating state of the memory cell array, writing an information item to a memory cell of the memory cell array.

* * * * *